United States Patent
Wang et al.

(10) Patent No.: US 8,841,593 B2
(45) Date of Patent: Sep. 23, 2014

(54) SENSING DEVICE AND IMAGE SENSOR MODULE THEREOF

(75) Inventors: Wei Chung Wang, Hsinchu (TW); Chi Chih Shen, Hsinchu (TW); Kuo Hsiung Li, Hsinchu (TW); Hui Hsuan Chen, Hsinchu (TW); Jui Cheng Chuang, Hsinchu (TW)

(73) Assignee: Pixart Imaging Inc., Hsinchu County (TW)

( * ) Notice: Subject to any disclaimer, the term of this patent is extended or adjusted under 35 U.S.C. 154(b) by 605 days.

(21) Appl. No.: 13/033,678

(22) Filed: Feb. 24, 2011

(65) Prior Publication Data

US 2012/0001054 A1    Jan. 5, 2012

(30) Foreign Application Priority Data

Jul. 2, 2010    (TW) .............................. 99212689 U

(51) Int. Cl.
*H01L 27/146* (2006.01)
*H01L 31/0203* (2014.01)
*H01L 31/0232* (2014.01)

(52) U.S. Cl.
CPC ..... *H01L 27/14618* (2013.01); *H01L 27/14625* (2013.01); *H01L 27/14621* (2013.01)
USPC ........ 250/208.1; 250/216; 250/239; 348/340; 257/432

(58) Field of Classification Search
USPC .................... 250/221, 222.1, 239, 216, 208.1; 257/431, 432, 433, 434, 435; 348/335, 348/340; 345/166; 356/404, 416, 419, 445
See application file for complete search history.

(56) References Cited

U.S. PATENT DOCUMENTS

| | | | | |
|---|---|---|---|---|
| 4,632,558 | A * | 12/1986 | Maassen et al. | 356/404 |
| 5,793,037 | A * | 8/1998 | Guillot et al. | 250/239 |
| 6,621,072 | B2 * | 9/2003 | Imoto | 250/239 |
| 6,686,580 | B1 * | 2/2004 | Glenn et al. | 250/208.1 |
| 6,775,077 | B1 * | 8/2004 | Feng | 359/831 |
| 6,992,846 | B2 * | 1/2006 | Feng | 359/831 |
| 7,358,482 | B2 * | 4/2008 | Chen | 250/239 |
| 8,471,191 | B2 * | 6/2013 | Zarem | 250/221 |
| 2001/0028393 | A1 * | 10/2001 | Tomida et al. | 348/207 |
| 2004/0183003 | A1 * | 9/2004 | Eslamy | 250/239 |
| 2005/0258350 | A1 * | 11/2005 | Van Arendonk | 250/239 |
| 2006/0017834 | A1 * | 1/2006 | Konno et al. | 348/335 |
| 2006/0163462 | A1 * | 7/2006 | Eslamy | 250/239 |
| 2006/0219884 | A1 * | 10/2006 | Tsukamoto et al. | 250/239 |
| 2006/0221225 | A1 * | 10/2006 | Tsukamoto et al. | 348/340 |
| 2006/0243896 | A1 * | 11/2006 | Chen | 250/239 |

(Continued)

*Primary Examiner* — John Lee
(74) *Attorney, Agent, or Firm* — Morris Manning & Martin LLP; Tim Tingkang Xia, Esq.

(57) ABSTRACT

An image sensor module is installed in a sensing device, and is used to detect a reflected light of an object. The image sensor module includes a carrier, a light sensing element, and a package body. The light sensing element is disposed on a substrate. The carrier is disposed on the substrate in the sensing device. The light sensing element is installed in the carrier, and is electrically connected with the substrate via multiple solder balls. The package body is installed on the carrier, and has a reflecting and diverting element, which is located between the light sensing element and the object and is used for reflecting reflected light of the object and diverting the reflected light towards a receiving direction of the light sensing element. The light sensing element receives the reflected light and generates a corresponding sensing signal.

19 Claims, 3 Drawing Sheets

(56) References Cited

U.S. PATENT DOCUMENTS

| | | |
|---|---|---|
| 2007/0002160 A1* | 1/2007 | Goto .............................. 348/340 |
| 2007/0210246 A1* | 9/2007 | Ellenberger et al. .......... 250/239 |
| 2008/0082000 A1* | 4/2008 | Thoms .......................... 600/476 |
| 2008/0291316 A1* | 11/2008 | Cheng ........................... 348/340 |
| 2009/0244355 A1* | 10/2009 | Horie ............................ 348/340 |
| 2010/0085466 A1* | 4/2010 | Fujimori et al. .............. 348/340 |
| 2010/0295822 A1* | 11/2010 | Wang ............................ 345/175 |
| 2010/0321494 A1* | 12/2010 | Peterson et al. .............. 348/143 |
| 2011/0299086 A1* | 12/2011 | Chen et al. ................... 356/445 |
| 2012/0001054 A1* | 1/2012 | Wang et al. ................. 250/208.1 |

* cited by examiner

SENSING DEVICE AND IMAGE SENSOR MODULE THEREOF

CROSS-REFERENCE TO RELATED APPLICATIONS

This non-provisional application claims priority under 35 U.S.C. §119(a) on Patent Application No(s). 099212689 filed in Taiwan, R.O.C. on Jul. 2, 2010, the entire contents of which are hereby incorporated by reference.

BACKGROUND OF THE INVENTION

1. Field of Invention

The present invention relates to an image sensor module, and more particularly to an image sensor module installed in a sensing device.

2. Related Art

In recent years, multi-media entertainment market is rapidly developed, and many game hosts attract a player to a background scene of a game by providing a colorful acousto-optic effect, and thus allow the player to be immersed in a cartoon or movie, so as to fully experience the entertainment. Software and hardware manufacturers continuously propose newer and better game software and game hosts, so as to occupy gigantic market business opportunity. As the newer and more special software and hardware are available, the game joystick, as the main game manipulation interface, definitely must be continuously developed and modified, so as to meet the demand of the pleasant sensation of the user during manipulation.

For example, a peripheral device dedicated to game manipulation, such as a game joystick or a game controller, allows for vivid and smooth manipulation by an operator during the game. Recently, a game controller capable of achieving wireless manipulation by means of optical sensing is further developed, such that the user can generate a corresponding control signal through a relative displacement of the game controller, so as to control cursor or interface manipulation settings in a game scene.

A conventional wireless game controller has an optical sensor module disposed therein for detecting an image formed by a light incident from the outside of the game controller, so as to generate a corresponding control signal. In order to successfully receive the light incident from the outside, the optical sensor module of the conventional wireless game controller is laterally placed on a circuit board, such that a light receiving direction of the optical sensor module directly faces an incident direction of the light, that is, the receiving direction of the optical sensor module is corresponding to an opening of a housing of the game controller.

Moreover, in order to achieve the configuration of the optical sensor module laterally placed on the circuit board at an angle of 90 degrees, the optical sensor module must be disposed in an electrical socket, such that the receiving direction of the optical sensor module is parallel to the reflection direction of the light by means of the lateral arrangement of the electrical socket; alternatively, the optical sensor module is laterally electrically disposed on the circuit board at an angle of 90 degrees by means of a design of a gold finger, such that the receiving direction of the optical sensor module is parallel to the reflection direction of the light.

In a conventional assembly method, the electric socket/gold finger is firstly electrically disposed on the circuit board and an electrical conduction relation is ensured, and then the optical sensor module is installed to the electric socket/gold finger. As assembly steps of the conventional optical sensor module are quite complicated, and the volume of the optical sensor module is small, one must be very careful when assembling the optical sensor module, so as to prevent the optical sensor module and the electric socket/gold finger from being damaged due to improper application of force.

Furthermore, since the conventional optical sensor module needs to use the structural design of the electrical socket or the gold finger in order to successfully receive the reflected light from the outside, the optical sensor module has a complex structure and requires more production procedures, miniaturization cannot be realized, and the manufacturing procedures are relatively increased, and thus the production efficiency cannot be improved, and the production cost cannot be lowered.

SUMMARY OF THE INVENTION

Accordingly, the present invention is a sensing device and an image sensor module thereof, so as to address a problem that a structure and manufacturing procedures of a conventional optical sensor module is too complex since the optical sensor module of a conventional wireless control device is horizontally disposed on a circuit board, and elements of the conventional optical sensor module have to be separately assembled and cannot be modularized.

The image sensor module of the present invention is electrically disposed on a substrate, and is used for detecting a reflected light of an object. The image sensor module comprises a carrier, a light sensing element, and a package body. The carrier has an accommodation space therein, and is disposed on the substrate. The light sensing element is disposed in the carrier, is electrically connected with the substrate via a plurality of solder balls, and has a receiving direction. The package body is installed on the carrier, and has a reflecting and diverting element, which is disposed between the object and the light sensing element. The reflecting and diverting element is used for reflecting the reflected light of the object, and diverting the reflected light to the receiving direction of the light sensing element, such that the light sensing element receives the reflected light and generates a corresponding sensing signal.

The sensing device of the present invention comprises a housing, a substrate, and an image sensor module. The housing has an accommodation space therein and has a through hole. The substrate is disposed in the housing. The image sensor module is electrically disposed on the substrate, and is used for detecting the reflected light of the object. The image sensor module comprises a carrier, a light sensing element, and a package body. The carrier is disposed on the substrate, and has an accommodation space therein. The light sensing element is disposed in the carrier, is electrically connected with the substrate via a plurality of solder balls, and has a receiving direction. The package body is installed on the carrier, and has a reflecting and diverting element, which is disposed between the object and the light sensing element. The reflected light of the object passes through the through hole and enters into the housing. The reflecting and diverting element reflects the reflected light, and diverts the reflected light to the receiving direction of the light sensing element, such that the light sensing element receives the reflected light and generates a corresponding sensing signal.

The efficacy of the present invention lies in that, the carrier, the light sensing element, and the package body of the image sensor module may be firstly assembled as a modular structure, and then are electrically disposed in the sensing device, and thus the manufacturing process is significantly simplified, so as to achieved the purpose of reducing the manufacturing cost and improving the assembly.

In addition, the refraction path of the reflected light of the object is changed by the reflecting and diverting element on the package body and is consistent with the receiving direction of the light sensing element, such that the image sensor module is disposed on the substrate without being rotated for an angle of 90 degrees by means of a socket or gold finger.

These and other aspects of the present invention will become apparent from the following description of the preferred embodiment taken in conjunction with the following drawings, although variations and modifications therein may be affected without departing from the spirit and scope of the novel concepts of the disclosure.

BRIEF DESCRIPTION OF THE DRAWINGS

The accompanying drawings illustrate one or more embodiments of the invention and, together with the written description, serve to explain the principles of the invention. Wherever possible, the same reference numbers are used throughout the drawings to refer to the same or like elements of an embodiment, and wherein.

DETAILED DESCRIPTION OF THE INVENTION

The image sensor module of the present invention is applicable in sensing devices. The sensing devices comprise, but are not limited to, mobile phones, joystick control devices, game handles, and other peripheral sensing control devices. In the detailed description of the present invention below, the game handle is taken as a preferred embodiment of the present invention. However, the accompanying drawings are merely provided for reference and description, but not intended to limit the present invention.

Figure 1A:
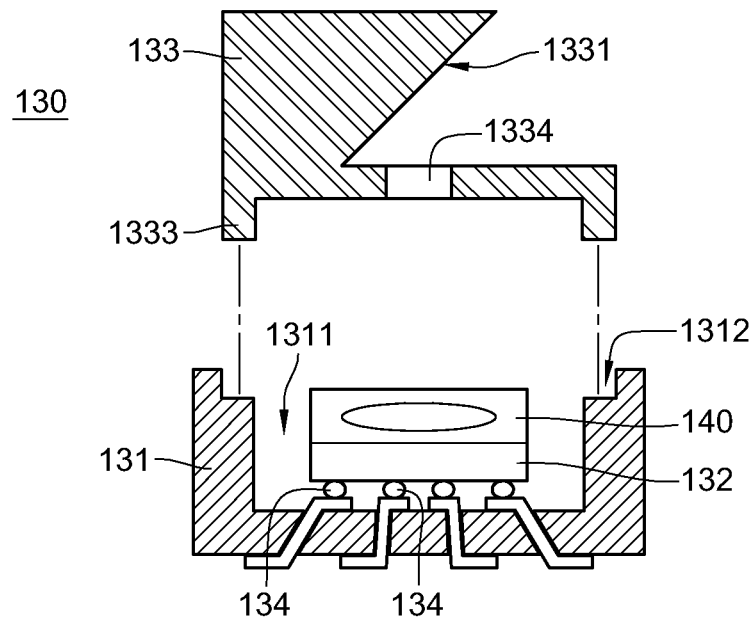
FIG. 1A is a schematic view of an image sensor module according to the present invention.
Figure 1B:
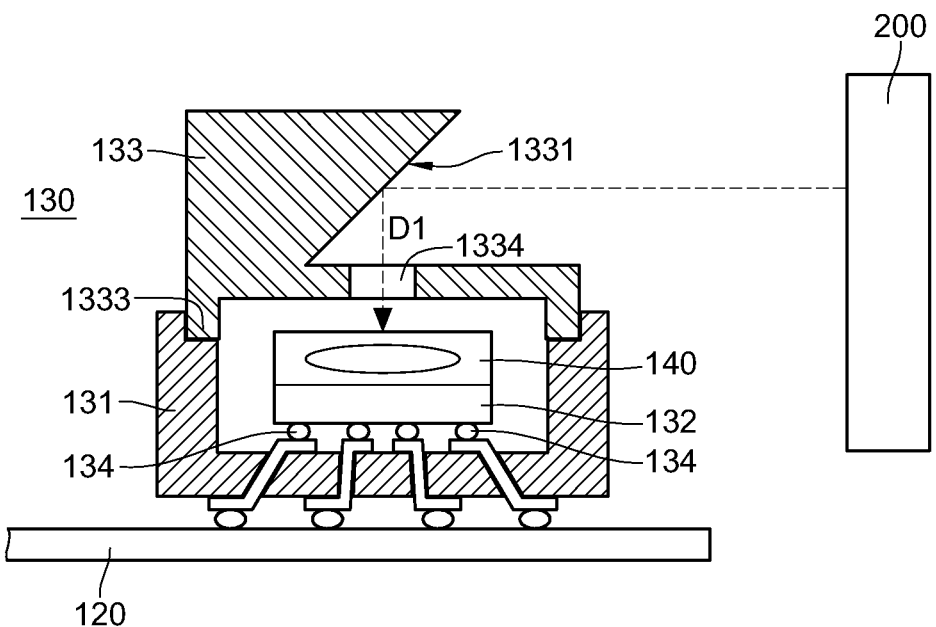
FIG. 1B is a schematic view of an image sensor module electrically disposed on a substrate according to the present invention.

FIG. 1A and FIG. 1B are schematic views of an image sensor module according to the present invention. Referring to FIG. 1, an image sensor module 130 of the present invention is electrically disposed on a substrate 120, and is used for detecting a reflected light of an object 200. The image sensor module 130 comprises a carrier 131, a light sensing element 132, and a package body 133.

The carrier 131 is disposed on a surface of the substrate 120, and has an accommodation space therein. An opening 1311 is disposed on an upper surface of the carrier 131, such that the light sensing element 132 enters through the opening 1311 and is installed in the carrier 131. The light sensing element 132 is electrically connected with the substrate 120 via a plurality of solder balls 134. Furthermore, the light sensing element 132 has a receiving direction D1 for receiving the reflected light, and the receiving direction D1 is substantially parallel to the object 200.

Still referring to FIG. 1A and FIG. 1B, the package body 133 is installed on the carrier 131, and covers the opening 1311 of the carrier 131, such that the carrier 131 and the package body 133 form an integral structure. The package body 133 has a reflecting and diverting element 1331, which is located between the light sensing element 132 and the object 200 and corresponds to the receiving direction D1 of the light sensing element 132, for example, the reflecting and diverting element 1331 is located in the receiving direction D1, but the present invention is not limited thereto. The reflecting and diverting element 1331 has the a effect of diverting and reflecting the reflected light of the object 200 to the receiving direction D1 of the light sensing element 132. The light sensing element 132 receives and senses the reflected light, and generates a corresponding sensing signal.

It should be noted that, the package body 133 and the reflecting and diverting element 1331 of this embodiment are an integral structure. However, persons skilled in the art also may assemble the package body 133 and the reflecting and diverting element 1331 as an integral structure by bonding, welding, clamping, or other suitable methods, and the present invention is not limited thereto. Furthermore, the reflecting and diverting element 1331 may be a reflective mirror or a reflective prism. However, persons skilled in the art also may adopt a light guiding means of a different type, and the present invention is not limited thereto.

As shown in FIG. 1A and FIG. 1B, the package body 133 further has a light hole 1334 disposed thereon, which corresponds to the light sensing element 132 and is located in the receiving direction D1. When the reflecting and diverting element 1331 diverts and reflects the reflected light of the object 200 to the receiving direction D1 of the light sensing element 132, the reflected light enters into the light sensing element 132 through the light hole 1334.

The substrate 120 of the present invention may be a circuit board, and thus the light sensing element 132 is electrically disposed on the substrate 120. However, persons skilled in the art also may electrically connect the light sensing element 132 to an external element in an external connection manner, and the present invention is not limited thereto. Moreover, the detection and computation mode of the image sensor module 130 comprises, but is not limited to, an image detection mode or an optical refraction change detection mode, and since this part is not a subject matter of the present invention, the details will not described herein. The light sensing element 132 of the present invention may be, but is not limited to, a charged coupled device (CCD) or a complementary metal-oxide semiconductor (CMOS).

Furthermore, the carrier 131 may be made of liquid crystal polyester (LCP), polyphthalamide (PPA), or other high-temperature resistant polymer materials. The package body 133 may also be made of LCP, PPA, or other high-temperature resistant polymer materials, and the present invention is not limited thereto.

As shown in FIG. 1A and FIG. 1B, the carrier 131 has a recessed slot 1312 disposed near the opening 1311, and the package body 133 has an insert block 1333 corresponding to the slot 1312 protruding from the package body 133. When the package body 133 covers the opening 1311 of the carrier 131, the insert block 1333 of the package body 133 is fastened in the slot 1312 of the carrier 131, such that the package body 133 is fixed on the carrier 131 and will not get loose. However, persons skilled in the art also may bond the package body 133 onto the carrier 131 by dispensing adhesive or other suitable methods, and the present invention is not limited thereto.

In addition, the image sensor module 130 of the present invention further comprises a lens 140, which is disposed above the light sensing element 132 and corresponds to the receiving direction D1 of the light sensing element 132. The lens 140 may be, but is not limited to, plate-like light transmissive plate, single-concave lens, double-concave lens, single-convex lens, and double-convex lens.

Figure 2:
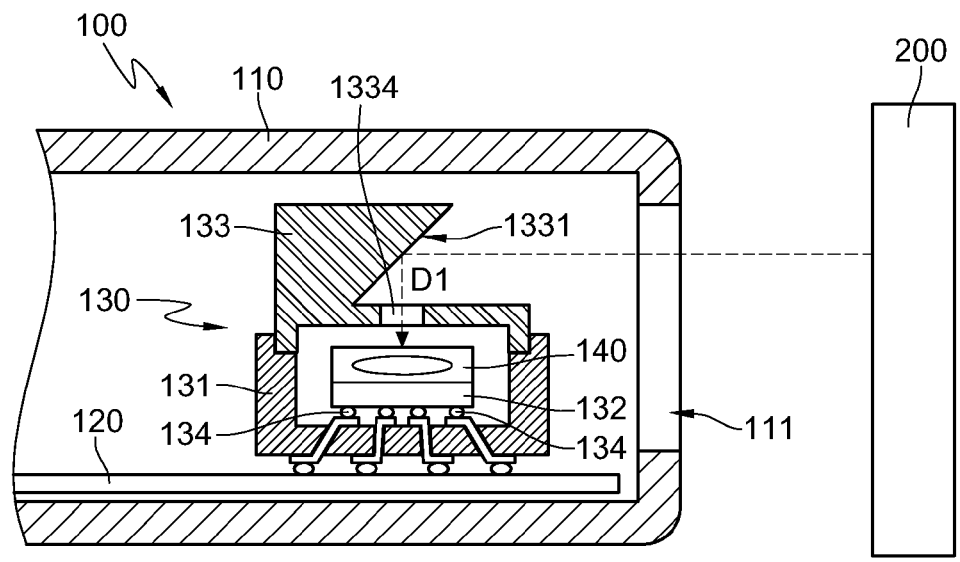
FIG. 2 is a schematic cross-sectional view of a sensing device according to a first embodiment of the present invention.

In particular, FIG. 2 is a schematic cross-sectional view of a sensing device according to a first embodiment of the present invention. A sensing device 100 of the first embodiment comprises a housing 110, a substrate 120, and the image sensor module 130 described above. The housing 110 is substantially a rectangular structure, but the present invention is not limited thereto. The housing 110 has an accommodation space therein, for accommodating the substrate 120 and the image sensor module 130. A through hole 111 is disposed on a side surface of the housing 110.

Still referring to FIG. 2, the image sensor module 130 according to the first embodiment of the present invention is used for detecting a reflected light of an object 200 and comprises a carrier 131, a light sensing element 132, and a package body 133. The carrier 131 is disposed on a surface of the substrate 120, and has an accommodation space therein. An opening 1311 is disposed on an upper surface of the carrier 131, such that the light sensing element 132 enters through the opening 1311 and is installed in the carrier 131. The light sensing element 132 is electrically connected with the substrate 120 via a plurality of solder balls 134. In particular, the solder balls 134 are electrically connected with the external substrate 120 via the carrier 131 (as shown in FIG. 1B). The solder balls 134 may be electrically connected with the substrate 120 by conductive solder balls, a surface mount/mounting technology (SMT), or a plated through hole (PTH) technology. The light sensing element 132 has a receiving direction D1 for receiving the reflected light, and the receiving direction D1 is substantially parallel to the object 200.

The package body 133 is installed on the carrier 131, and covers the opening 1311 of the carrier 131, such that the carrier 131 and the package body 133 form an integral structure. The package body 133 has a reflecting and diverting element 1331, which is located between the light sensing element 132 and the object 200 and corresponds to the receiving direction D1 of the light sensing element 132, for example, the reflecting and diverting element 1331 is located in the receiving direction D1, but the present invention is not limited thereto.

In particular, the light sensing element 132 is vertically disposed on the substrate 120, and thus the receiving direction D1 of the light sensing element 132 is also vertical to the substrate 120. The receiving direction D1 is parallel to the object 200, and thus the object 200 is vertical to the substrate 120.

It should be noted that, the package body 133 and the reflecting and diverting element 1331 of this embodiment are an integral structure. However, persons skilled in the art also may assemble the package body 133 and the reflecting and diverting element 1331 as an integral structure by bonding, welding, clamping, or other suitable methods, and the present invention is not limited thereto.

As shown in FIG. 2, the package body 133 further has a light hole 1334 disposed thereon, which corresponds to the light sensing element 132 and is located in the receiving direction D1. When the reflecting and diverting element 1331 diverts and reflects the reflected light of the object 200 to the receiving direction D1 of the light sensing element 132, the reflected light enters into the light sensing element 132 through the light hole 1334.

The substrate 120 of the present invention may be a circuit board, and thus the light sensing element 132 is electrically disposed on the substrate 120. However, persons skilled in the art also may electrically connect the light sensing element 132 to an external element in an external connection manner, and the present invention is not limited thereto. Moreover, the detection and computation mode of the image sensor module 130 comprises, but is not limited to, an image detection mode or an optical refraction change detection mode, and since this part is not a subject matter of the present invention, the details will not described herein. The light sensing element 132 of the present invention may be, but is not limited to, a CCD or a CMOS.

Furthermore, the carrier 131 may be made of liquid crystal polyester (LCP), polyphthalamide (PPA), or other high-temperature resistant polymer materials. The package body 133 may also be made of LCP, PPA, or other high-temperature resistant polymer materials, and the present invention is not limited thereto.

As shown in FIG. 2, the carrier 131 has a recessed slot 1312 disposed near the opening 1311, and the package body 133 has an insert block 1333 corresponding to the slot 1312 protruding from the package body 133. When the package body 133 covers the opening 1311 of the carrier 131, the insert block 1333 of the package body 133 is fastened in the slot 1312 of the carrier 131, such that the package body 133 is fixed on the carrier 131 and will not get loose. However, persons skilled in the art also may bond the package body 133 onto the carrier 131 by dispensing adhesive or other suitable methods, and the present invention is not limited thereto.

In addition, the image sensor module 130 of the present invention further comprises a lens 140, which is disposed above the light sensing element 132 and corresponds to the receiving direction D1 of the light sensing element 132. The lens 140 may be, but is not limited to, plate-like light transmissive plate, single-concave lens, double-concave lens, single-convex lens, and double-convex lens.

As shown in FIG. 2, the reflected light of the object 200 passes through the through hole 111 of the housing 110 and reaches the reflecting and diverting element 1331 on the package body 133, and the reflecting and diverting element 1331 diverts and reflects the reflected light of the object 200 to the receiving direction D1 of the light sensing element 132. The lens 140 generates an image with the reflected light, and the light sensing element 132 receives and senses the image, and generates a corresponding sensing signal. The light sensing element 132 of the present invention may be a CCD or CMOS, but is not limited thereto.

Figure 4:
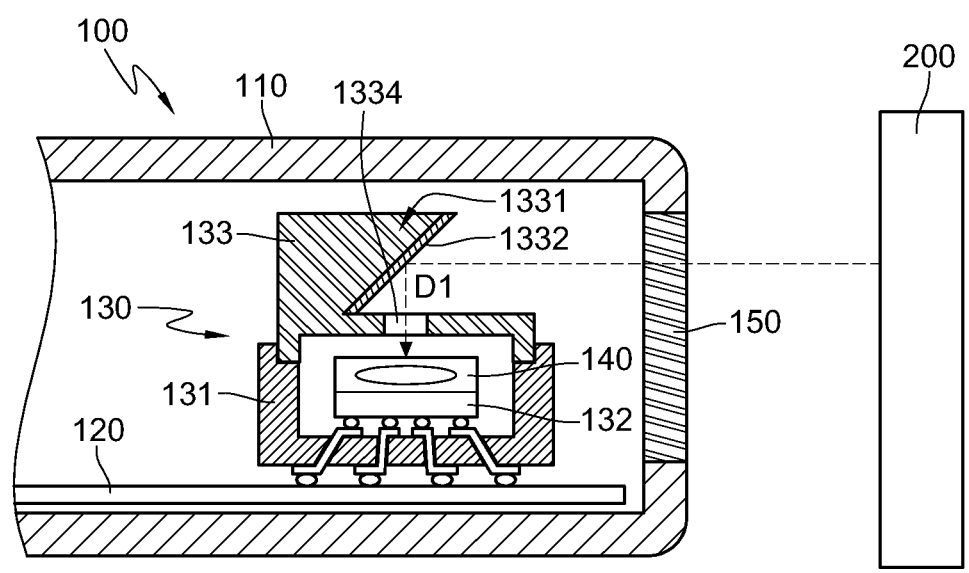
FIG. 4 is a schematic cross-sectional view of a sensing device according to a third embodiment of the present invention.

The reflecting and diverting element 1331 may be a reflective mirror or a reflective prism. However, persons skilled in the art also may adopt a light guiding means of a different type, and the present invention is not limited thereto. Furthermore, the reflecting and diverting element 1331 of the present invention may have a reflective film 1332 selectively coated on a surface thereof, so as to increase the reflectivity of the reflecting and diverting element 1331 (the schematic cross-sectional view of a third embodiment shown in FIG. 4). The reflective film 1332 may be made of, for example, but is not limited to, aluminum (Al), silver (Ag), or other metallic materials.

Figure 3:
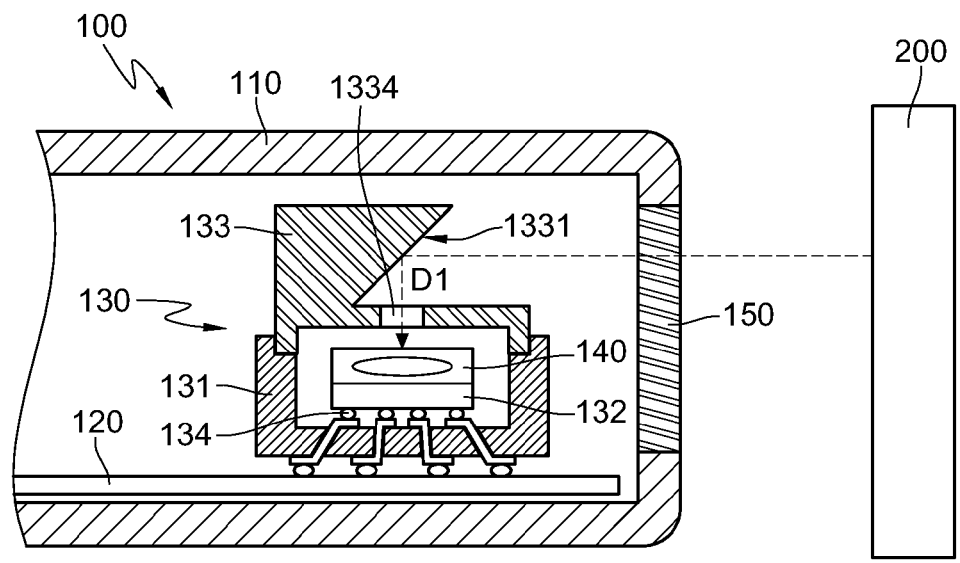
FIG. 3 is a schematic cross-sectional view of a sensing device according to a second embodiment of the present invention.

Referring to the schematic cross-sectional view in FIG. 3, a structure of a sensing device 100 of the second embodiment is similar to the structure of the sensing device 100 of the first embodiment, except that the sensing device 100 of the second embodiment further comprises a color filter 150, in addition to the housing 110, the substrate 120, the carrier 131, the light sensing element 132, the package body 133, the reflecting and diverting element 1331, and the lens 140. The color filter 150 is installed in the through hole 111 of the housing 110, and thus the color filter 150 is located in a transmission path of the reflected light of the object 200, such that the reflected light entering the housing 110 is limited to a light having a certain wavelength.

The image sensor module of the present invention is applicable in sensing devices for which a control interface is effected by means of image sensing, such as a mobile phone, a joystick control device, a game handle, and the sensing devices can achieve the objective of imaging sensing and control by simply disposing the image sensor module of the present invention in the sensing devices.

Taking a mobile phone as an example, after the image sensor module of the present invention is installed in the mobile phone, the cell phone is enabled to sense external images, and execute a variety of preset programs and functions in a non-touch manner by means of image sensing. Taking a joystick control device as an example, after the image sensor module of the present invention is installed in the joystick control device, the joystick control device is enabled to sense external images, and control a displacement motion of a cursor by means of image sensing.

The above is merely a simple description of the applications in the mobile phone and the joystick control device, the application range of the sensing device and the image sensor module thereof according to the present invention is not limited thereto, and the image sensor module of the present invention can further be applied in various sensing devices requiring control by means of image sensing.

The image sensor module in the sensing device of the present invention may be assembled as a modularized structure in advance, which significantly simplifies the overall manufacturing steps, so as to reduce the manufacturing cost and improve the assembility, and improve the assembly efficiency at the same time.

Furthermore, in the sensing device of the present invention, the reflecting and diverting element of the image sensor module diverts and refracts the reflected light of the object to the receiving direction of the light sensing element, such that a travel path of the reflected light of the object is consistent with the receiving direction of the light sensing element. Therefore, the light sensing element will not be laterally disposed on the substrate by means of a socket or a gold finger.

What is claimed is:

1. An image sensor module, electrically disposed on a substrate, for detecting a reflected light of an object, the image sensor module comprising:
   a carrier, having an accommodation space therein, and disposed on the substrate;
   a plurality of first solder balls and a plurality of second solder balls disposed on the carrier, wherein the plurality of first solder balls are installed inside the accommodation space, and the plurality of second solder balls are disposed outside the accommodation space;
   a light sensing element, installed in the carrier and in direct contact with the plurality of first solder balls, the light sensing element being electrically connected with the substrate via the plurality of first solder balls and the plurality of second solder balls, and having a receiving direction; and
   a package body, installed on the carrier, having a reflecting and diverting element and a light hole, wherein the reflecting and diverting element is located between the object and the light hole, the light hole is located between the reflecting and diverting element and the light sensing element, the reflecting and diverting element reflects and diverts the reflected light towards the receiving direction, and through the light hole, such that the light sensing element receives the reflected light and generates a corresponding sensing signal.

2. The image sensor module according to claim 1, wherein the carrier further has an opening, the light sensing element is installed in the carrier from the opening, and the package body covers the opening.

3. The image sensor module according to claim 1, further comprising a lens, disposed on the light sensing element, and corresponding to the receiving direction of the light sensing element.

4. The image sensor module according to claim 1, further comprising a color filter, disposed between the object and the reflecting and diverting element.

5. The image sensor module according to claim 1, wherein the reflecting and diverting element further has a reflective film on a surface thereof.

6. The image sensor module according to claim 1, wherein the carrier further has a slot, the package body has an insert block corresponding to the slot, and the insert block is fastened in the slot, such that the package body is fixed the carrier.

7. The image sensor module according to claim 1, wherein the package body and the reflecting and diverting element are an integral structure.

8. The image sensor module according to claim 1, wherein the reflecting and diverting element is a reflective mirror.

9. The image sensor module according to claim 1, wherein the reflecting and diverting element is a reflective prism.

10. A sensing device, comprising:
    a housing, having an accommodation space therein, and having a through hole;
    a substrate, disposed in the housing; and
    an image sensor module, electrically disposed on the substrate, for detecting a reflected light of an object, wherein the image sensor module comprises:
    a carrier, having an accommodation space therein, and disposed on the substrate;
    a plurality of first solder balls and a plurality of second solder balls disposed on the carrier, wherein the plurality of first solder balls are installed inside the accommodation space, and the plurality of second solder balls are disposed outside the accommodation space;
    a light sensing element, installed in the carrier and in direct contact with the plurality of first solder balls, the light sensing element being electrically connected with the substrate via the plurality of first solder balls and the plurality of second solder balls, and having a receiving direction; and
    a package body, installed on the carrier, and having a reflecting and diverting element located between the light sensing element and the object;
    wherein, the reflected light of the object passes through the through hole and enters into the housing, the reflecting and diverting element reflects the reflected light and diverts the reflected light towards the receiving direction, such that the light sensing element receives the reflected light and generates a corresponding sensing signal.

11. The sensing device according to claim 10, wherein the carrier further has an opening, the light sensing element is installed in the carrier from the opening, and the package body covers the opening.

12. The sensing device according to claim 10, wherein the image sensor module further has a lens, disposed on the light sensing element, and corresponding to the receiving direction of the light sensing element.

13. The sensing device according to claim 10, further comprising a color filter, disposed in the through hole, and located between the object and the reflecting and diverting element.

14. The sensing device according to claim 10, wherein the reflecting and diverting element further has a reflective film on a surface thereof.

15. The sensing device according to claim 10, wherein the carrier further has a slot, the package body has an insert block corresponding to the slot, and the insert block is fastened in the slot, such that the package body is fixed on the carrier.

16. The sensing device according to claim 10, wherein the package body further has a light hole, corresponding to the light sensing element.

17. The sensing device according to claim 10, wherein the package body and the reflecting and diverting element are an integral structure.

18. The sensing device according to claim 10, wherein the reflecting and diverting element is a reflective mirror.

19. The sensing device according to claim 10, wherein the reflecting and diverting element is a reflective prism.

* * * * *